US012770701B2

(12) United States Patent
Negishi

(10) Patent No.: US 12,770,701 B2
(45) Date of Patent: Oct. 20, 2026

(54) SEMICONDUCTOR DEVICE AND INKJET PRINTING ELEMENT SUBSTRATE

(71) Applicant: CANON KABUSHIKI KAISHA, Tokyo (JP)

(72) Inventor: Toshio Negishi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 221 days.

(21) Appl. No.: 18/673,427

(22) Filed: May 24, 2024

(65) Prior Publication Data

US 2024/0404612 A1 Dec. 5, 2024

(30) Foreign Application Priority Data

Jun. 2, 2023 (JP) ................................. 2023-091553

(51) Int. Cl.

| | |
|---|---|
| ***G11C 17/18*** | (2006.01) |
| ***B41J 2/14*** | (2006.01) |
| ***G11C 17/16*** | (2006.01) |
| ***H10B 20/25*** | (2023.01) |

(52) U.S. Cl.

CPC ................. *G11C 17/18* (2013.01); *B41J 2/14* (2013.01); *G11C 17/16* (2013.01); *H10B 20/25* (2023.02); *B41J 2002/14491* (2013.01)

(58) Field of Classification Search

CPC ................................ G11C 17/18; H10B 20/25

USPC ........................................................... 365/96

See application file for complete search history.

(56) References Cited

U.S. PATENT DOCUMENTS

| | | | | | |
|---|---|---|---|---|---|
| 11,837,301 | B2 | 12/2023 | Fukuda et al. | | |
| 2003/0098736 | A1* | 5/2003 | Uchikoba | H02M 3/07 | 327/534 |
| 2005/0045919 | A1 | 3/2005 | Kaeriyama | | |
| 2008/0002481 | A1* | 1/2008 | Gogl | G11C 7/067 | 327/51 |

(Continued)

FOREIGN PATENT DOCUMENTS

| | | | |
|---|---|---|---|
| JP | 2005101535 | A | 4/2005 |
| JP | 2010050312 | A | 3/2010 |

(Continued)

OTHER PUBLICATIONS

Extended European Search Report dated Sep. 13, 2024 in counterpart European Patent Appln. No. 24178656.

(Continued)

*Primary Examiner* — Muna A Techane
(74) *Attorney, Agent, or Firm* — Venable LLP

(57) ABSTRACT

An aspect of the present disclosure is a semiconductor device including: a property-variable element, an electrical property thereof changes with application of a higher voltage than a predetermined voltage; a write control switch that switches between conductive and non-conductive states based on a first signal; a first circuit that outputs a write voltage based on a power source and a second signal, the electrical property of the element being changed due to the application of the higher voltage to the element when the write voltage is output from the first circuit and the switch is in the conductive state; wiring for applying the higher voltage to the element; a second circuit that detects noise at the power source; and a noise discharge switch that enables noise current to be discharged from the wiring when the second circuit detects noise at the power source.

18 Claims, 10 Drawing Sheets

(56) References Cited

U.S. PATENT DOCUMENTS

| | | | | |
|---|---|---|---|---|
| 2010/0128511 | A1* | 5/2010 | Worley | G11C 17/18 365/96 |
| 2011/0058439 | A1* | 3/2011 | Lee | G11C 8/08 365/226 |
| 2012/0140545 | A1 | 6/2012 | Kim | |
| 2017/0173943 | A1 | 6/2017 | Fujii | |
| 2019/0057754 | A1 | 2/2019 | Huang | |
| 2022/0293199 | A1* | 9/2022 | Taniguchi | B41J 2/0458 |

FOREIGN PATENT DOCUMENTS

| | | | |
|---|---|---|---|
| JP | 2017117854 | A | 6/2017 |
| JP | 2022138607 | A | 9/2022 |
| WO | 2011/052176 | A1 | 5/2011 |

OTHER PUBLICATIONS

Japanese Office Action dated Apr. 30, 2025 in counterpart Japanese Patent Appln. No. 2023-091553.
Japanese Office Action dated Jul. 22, 2025 in counterpart Japanese Patent Appln. No. 2023-091553.
Korean Office Action dated Mar. 19, 2026 in counterpart Korean Patent Appln. No. 10-2024-0069049.

* cited by examiner

SEMICONDUCTOR DEVICE AND INKJET PRINTING ELEMENT SUBSTRATE

BACKGROUND OF THE DISCLOSURE

Field of the Disclosure

The present disclosure relates to a semiconductor device and an inkjet printing element substrate.

Description of the Related Art

In recent years, one time programmable (OTP) memory has been used in a semiconductor device to record product-specific information such as a chip ID and configuration parameters, after completion of a product. There are two kinds of OTP memory: one using a fuse element and one using an antifuse element. Japanese Patent Laid-Open No. 2022-138607 (hereinafter referred to as a literature) discloses a substrate having an antifuse element and a voltage application circuit for applying voltage to the antifuse element. On this substrate, information can be written to the antifuse element by application of voltage of a predetermined value or above from the voltage application circuit to the antifuse element.

However, on the substrate disclosed in the literature, there is a possibility that information may be erroneously written to the antifuse element due to power source noise. For example, an erroneous write to the antifuse element may be caused in a case where a surge voltage due to electrostatic discharge, lightening, or the like passes through the voltage generation circuit and reaches the antifuse element. This is true not only for the antifuse element but also for other property-variable elements.

SUMMARY OF THE DISCLOSURE

An aspect of the present disclosure is a semiconductor device including: a property-variable element, an electrical property of which changes with application of a voltage equal to or higher than a predetermined voltage to the property-variable element; a write control switch that switches between a conductive state and a non-conductive state based on a first write control signal for controlling a write to the property-variable element; a voltage generation circuit that outputs a write voltage from an output terminal of the voltage generation circuit based on a power source and a second write control signal for controlling a write to the property-variable element, the electrical property of the property-variable element being changed due to the application of the voltage equal to or higher than the predetermined voltage to the property-variable element when the write voltage is output from the output terminal of the voltage generation circuit and the write control switch is in the conductive state; wiring for use to apply the voltage equal to or higher than the predetermined voltage to the property-variable element; a noise detection circuit that detects noise at the power source; and a noise discharge switch that enables noise current to be discharged from the wiring in an event where the noise detection circuit detects noise at the power source.

Further features of the present disclosure will become apparent from the following description of exemplary embodiments with reference to the attached drawings.

DESCRIPTION OF THE EMBODIMENTS

First Embodiment

Figure 1:
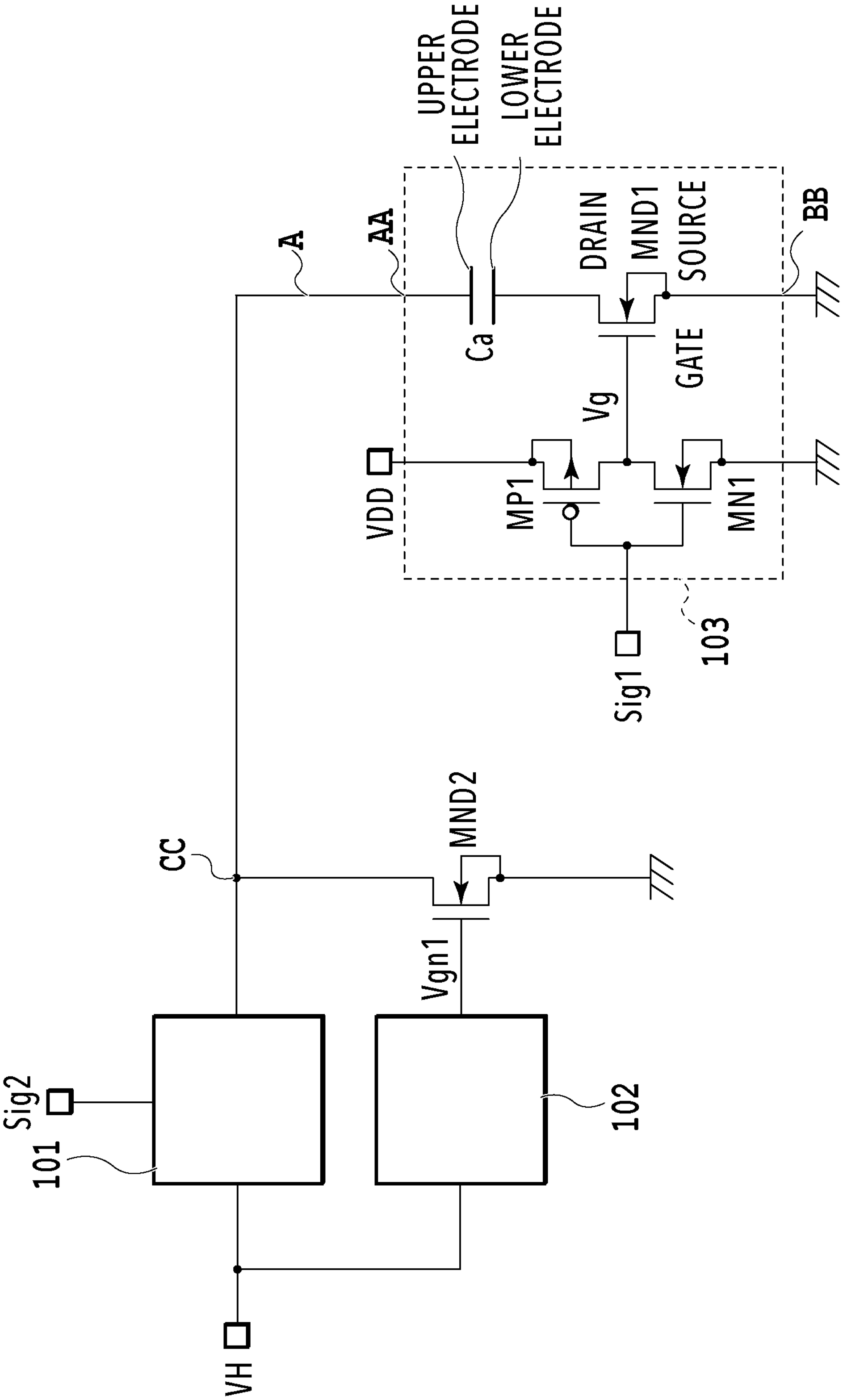
FIG. 1 is an example circuit configuration 1 of a semiconductor device of a first embodiment.

FIG. 1 shows an example circuit configuration of a semiconductor device in a state before information is written to an antifuse element (also referred to as a "property-variable element") Ca.

The semiconductor device of the present embodiment has a memory unit 103 having a transistor MP1, a transistor MN1, a transistor MND1, and the antifuse element Ca. The antifuse element Ca is an element configured to have a first resistance value before information is written thereto and have a second resistance value smaller than the first resistance value after information is written thereto. In this way, the resistance value of the antifuse element Ca is changed due to an information write operation. The first resistance value is preferably large. Ideally, the first resistance value may be infinite. Also, it is preferable that the difference between the first resistance value and the second resistance value be large. For example, the antifuse element Ca functions as a capacitance element before information is written thereto and functions as a resistance value after information is written thereto. Since FIG. 1 shows a state before information is written to the antifuse element Ca, the antifuse element Ca is denoted by a circuit symbol for a capacitance element. With such a configuration, information written to the antifuse element Ca can be held based on a change in the resistance value of the antifuse element Ca.

In FIG. 1, the transistor MP1 is a p-type transistor, the transistor MN1 is an n-type transistor, and the circuit is configured such that a first write control signal Sig1 is inputted to the gates of the transistor MP1 and the transistor MN1.

Also, a power supply voltage VDD (e.g., 3.3 V) is supplied to the source and the back gate of the transistor MP1, and the drain of the transistor MP1 is connected to the drain of the transistor MN1 and the gate of the transistor MND1. The source and the back gate of the transistor MN1 are connected to a ground GND. The transistor MP1 and the transistor MN1 form a logic circuit (a logic inverter circuit in FIG. 1) and output a signal Vg to the gate of the transistor MND1, the signal Vg being the first write control signal Sig1 logically inverted.

The transistor MND1 is an n-type high-withstand-voltage transistor and controls application of voltage to the antifuse element Ca. For example, the transistor MND1 may be an NMOS transistor. A high-withstand-voltage transistor here is a transistor which withstands higher voltage than the transistors used in the logic circuit (such as the transistor MP1 and the transistor MN1). The high-withstand-voltage transistor is preferably configured not to break even with application of a high voltage (e.g., 32 V) which transistors in a typical logic circuit such as a controller cannot withstand. Also, in a case where the transistor MP1 and the transistor MN1 forming the logic circuit are transistors that withstand lower voltage than the transistor MND1, the logic circuit can operate at high speed.

The antifuse element Ca is connected to a second terminal BB via the transistor MND1. As the antifuse element Ca, for example, an antifuse element having a metal-oxide-semiconductor (MOS) structure can be used. The antifuse element Ca has its upper electrode connected to a first terminal AA and its lower electrode connected to the drain of the transistor MND1. The source of the transistor MND1 is connected to the second terminal BB. Thus, the antifuse element Ca and the transistor MND1 are connected in series between the first terminal AA and the second terminal BB.

The first terminal AA and the second terminal BB are connections for electrically connecting the memory unit 103 to an external circuit and are terminals for applying voltage to the antifuse element Ca or measuring voltage generated at the antifuse element Ca. For example, the potential at the first terminal AA can be at high voltage (e.g., 32 V) in the event of an information write. The second terminal BB is connected to the ground GND.

Based on a second write control signal Sig2, a voltage generation circuit 101 switches whether to output high voltage (e.g., 32 V) applied to a VH terminal, which is an external connection terminal, to wiring A. As shown in FIG. 1, the wiring A is wiring for connecting the output terminal of the voltage generation circuit 101 and the first terminal AA to each other. As shown in, for example, FIG. 2, the voltage generation circuit 101 can be configured to include, for example, a p-type high-withstand-voltage transistor MPD1. Alternatively, as shown in FIG. 3, the high-withstand-voltage transistor MPD1 may be configured to perform the switching operation based on a second write control signal Sig4 outputted from a write/read control circuit 307 additionally provided. The write/read control circuit 307 may include a step-up circuit that increases the voltage of the second write control signal Sig4 which has the logic circuit power supply voltage VDD to voltage corresponding to the operation voltage of the high-withstand-voltage transistor MPD1. Also, the voltage generation circuit 101 may include a step-down circuit that decreases the voltage at the VH terminal (e.g., 32 V) to a write voltage for the antifuse element (e.g., 24 V) in a case where the write voltage is lower than the high voltage applied to the VH terminal.

In the event where information is written to the antifuse element Ca, the difference in potential between the source and drain of the transistor MND1 in a conductive state is almost zero. Thus, the voltage applied to the antifuse element Ca is almost equal to the difference in potential between the terminal AA and the terminal BB. The potential at the terminal BB is the GND potential in the circuit, and in the event of a write, a write voltage in reference to the GND potential in the circuit is applied to the terminal AA. Thus, in the event of a write, the value of the difference in potential between the terminal AA and the terminal BB is almost equal to the write voltage. For this reason, the write voltage is set to a voltage equal to or higher than a predetermined voltage needed to write information to the antifuse element Ca.

The voltage 32 V described above as an example of the write voltage has a value which is a little over three times 10 V, which is the predetermined voltage needed to write information to the antifuse element Ca in the embodiment. This is to shorten the time it takes for a write from one to several seconds to several milliseconds. Also, the voltage 24 V described above as another example of the write voltage has a value which is a little over two times 10 V, which is the predetermined voltage needed to write information to the antifuse element Ca in the embodiment. This too is to shorten the time it takes for a write from one to several seconds to several milliseconds, but the length of time shortened is shorter than that in the case of 32 V.

Figure 2:
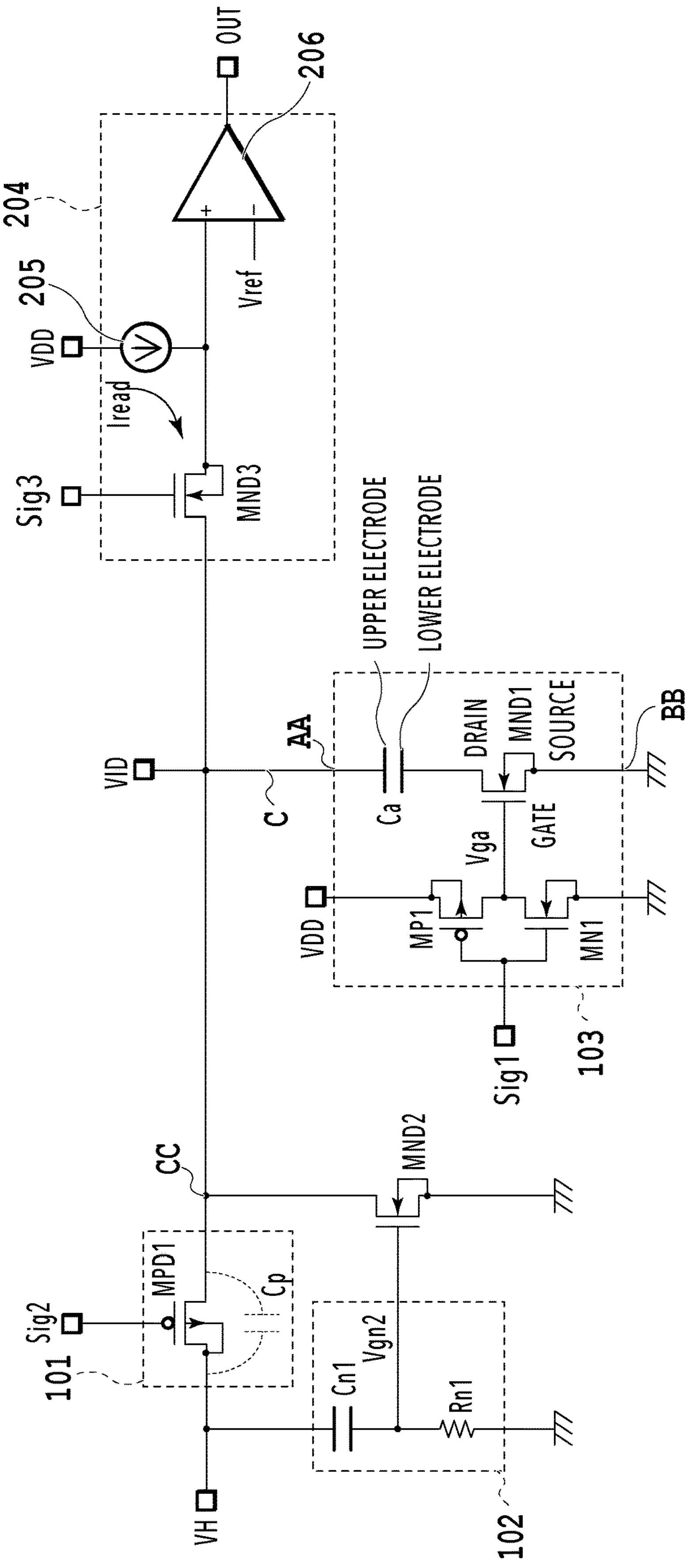
FIG. 2 is an example circuit configuration 2 of the semiconductor device of the first embodiment.
Figure 3:
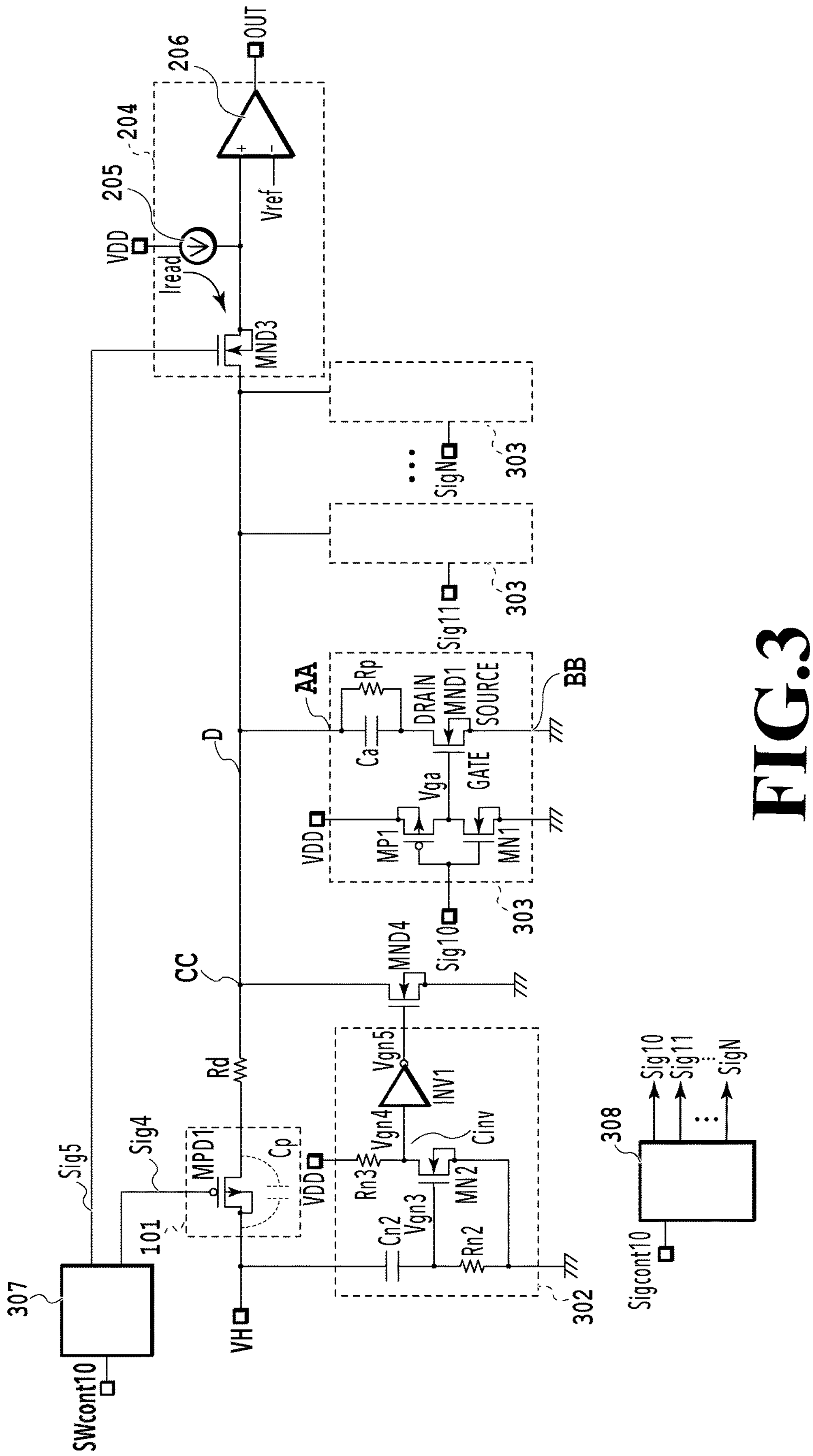
FIG. 3 is an example circuit configuration 3 of the semiconductor device of the first embodiment.

In the event of a read to detect whether the antifuse element Ca is in a write state, as shown in FIG. 2, voltage at a VID terminal electrically connected to the first terminal AA may be detected and determined from outside of the semiconductor device. Also, as shown in FIG. 2, the write state may be detected with a read circuit 204. In a case where the read circuit 204 is mounted on the same semiconductor device as the memory unit 103, the following configuration is preferable: a high-withstand-voltage transistor MND3 is connected between the read circuit 204 and wiring C, and the read circuit 204 and the wiring C are electrically isolated from each other except in the event of a read. A read control signal Sig3 for the transistor MND3 may be replaced with a read control signal Sig5 as shown in FIG. 3. The read control signal Sig5 here is, as shown in FIG. 3, outputted from the write/read control circuit 307, pairing with the second write control signal Sig4 from the voltage generation circuit 101. Note that in the event where the high-withstand-voltage transistor MPD1 and the transistor MND3 are turned on simultaneously, the voltage outputted from the voltage generation circuit 101 and the voltage outputted from the read circuit 204 may interfere with each other on the wiring C and cause malfunction. Further, in a case where the read circuit 204 is formed of a low-voltage transistor used in a logic circuit, high voltage applied to the VH terminal is applied to the low-voltage transistor, which may break the read circuit 204. For this reason, the write/read control circuit 307 avoids this by performing control so that the high-withstand-voltage transistor MPD1 and the transistor MND3 may turn on exclusively, using the second write control signal Sig4 and the read control signal Sig5. The high-withstand-voltage transistor MPD1 and the transistor MND3, while they are not on, provide high-impedance outputs and are not electrically connected to the wiring C.

In the configuration in FIG. 3, a plurality of memory units 303 each being a set of a property-variable element Ca, a parallel resistance element Rp, a write control switch MND1, and logic inverter circuits MP1, MN1 are provided for a single set of the voltage generation circuit 101, a noise detection circuit 302, and a noise discharge switch MND4. The parallel resistance element Rp will be described later. A write control signal generation unit 308 generates first write control signals Sig10 to SigN based on a signal Sigcont10 inputted thereto. The first write control signals Sig10 to SigN are used as first write control signals for the respective memory units 303.

Next, FIG. 2 is used to describe an operation performed in writing information to the antifuse element Ca. To write information to the antifuse element Ca, the high-withstand-voltage transistor MPD1 in the voltage generation circuit 101 is turned on. As a result, the high voltage (e.g., 32V) applied to the VH terminal is applied to the wiring C connected to the antifuse element Ca via the first terminal AA. In this event, the transistor MND3 is turned off (i.e., a high impedance state) to electrically isolate the read circuit 204 and the wiring C from each other. Next, the first write control signal Sig1 corresponding to the antifuse element Ca into which information is to be written is set to a signal of LOW level (e.g., the GND potential) to thereby switch the transistor MND1 from off (i.e., a non-conductive state) to on (i.e., a conductive state). As a result, the high voltage applied to the VH terminal is exerted to a gate insulation film between the upper and lower electrodes of the antifuse element Ca. Consequently, the gate insulation film of the antifuse element Ca experiences insulation breakdown, bringing the resistance value of the antifuse element Ca down greatly. Hence, the antifuse element Ca which was a capacitance element before the write is a resistance element after the write. In this way, the transistor MND1 is switched by the first write control signal Sig1 between the conductive state and the non-conductive state. Then, in the event where the transistor MND1 is brought to the conductive state by the first write control signal Sig1 in a period in which the write voltage is applied to the terminal AA, information is written to the antifuse element Ca. Thus, the transistor MND1 functions as a write control switch.

Next, FIG. 2 is used to describe an information read operation performed in a case where the read circuit 204 is mounted on the same semiconductor device as the antifuse element Ca. Before an information read, the high-withstand-voltage transistor MPD1 needs to be turned off (a high-impedance state) to electrically isolate the voltage at the VH terminal from the wiring C connected to the antifuse element Ca. Also, the transistor MND3 is turned on to electrically connect the read circuit 204 to the wiring C. In this state, the first write control signal Sig1 corresponding to the antifuse element Ca from which information is to be read is set to a signal of LOW level to thereby turn the transistor MND1 on. As a result, a read current Iread is supplied from a current source 205 in the read circuit 204 to the antifuse element Ca. Then, a read voltage Vread, which is Iread×Ra where Ra is the resistance of the antifuse element Ca, is inputted to the non-inverting input terminal of a voltage comparator 206 in the read circuit 204 via the wiring C. The voltage comparator 206 compares the read voltage Vread with a reference voltage Vref inputted to its inverting input terminal and outputs an output signal with a logical value "High" to an output terminal OUT in a case where the read voltage Vread is higher than the reference voltage Vref. By contrast, the voltage comparator 206 outputs an output signal with a logical value "Low" in a case where the read voltage Vread is lower than the reference voltage Vref. The antifuse element Ca is typically formed of an insulation film and therefore has a large resistance value in a non-written state and has a small resistance value once the insulation film breaks down upon a write and is brought into the conductive state. In the circuit shown in FIG. 2, an output signal with a logical value "High" is outputted in a case where information has yet to be written, and an output signal with a logical value "Low" is outputted in a case where information has already been written. Note that an output signal with reverted logic may be outputted by adding a logic inverter circuit or changing the non-inverting input terminal and the inverting input terminal with each other. Also, the configuration of the read circuit 204 may use a method different from the method involving detection of a resistance value using the power source in the present embodiment.

In the manufacturing process, there is a possibility that an extremely large surge voltage may enter the semiconductor device from the VH terminal due to electrostatic discharge (ESD), lightening surge entering the AC power source of the building, or the like. Also, the same situation may occur in the user's usage environment. Particularly during an information read, the high-withstand-voltage transistor MPD1 shown in FIG. 2 is off. However, in a case where a surge voltage is applied to the VH terminal, the surge voltage may enter the wiring C via a parasitic capacitance Cp formed between the source and the drain of the p-type high-withstand-voltage transistor MPD1 in the semiconductor substrate. Because the transistor MND3 is on in this event, the high surge voltage is applied to the read circuit 204, which may break the read circuit 204.

Also, during an information read, the transistor MND1 is on, and hence, the lower electrode of the antifuse element Ca is connected to the ground GND. Thus, even with a relatively small surge voltage of approximately 10 V, which is a breakdown voltage for the insulating film of the antifuse element Ca, application of the surge voltage to the upper electrode may cause information to be written to the antifuse element Ca. Then, information may be written to the antifuse element Ca for which no information write was planned, causing a change in the information recorded in the semiconductor device.

The above-described breakage of the read circuit 204 and the above-described erroneous write may also occur while electrical measurement is being performed in the product shipping inspection process, or more specifically, for example, examination of the soundness of the antifuse element Ca or examination of the operation of the read circuit.

Figure 4:
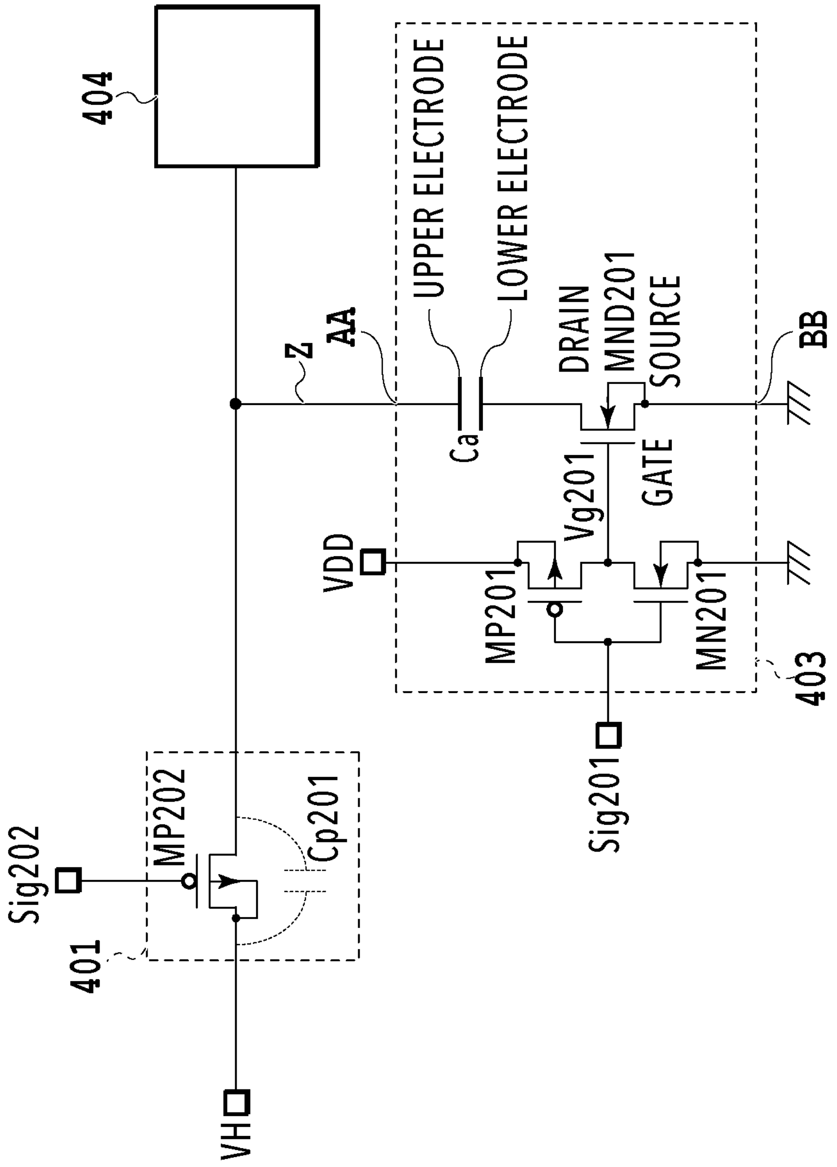
FIG. 4 is an example circuit configuration of a comparative example.

FIG. 4 shows a circuitry diagram as a comparative example. A voltage generation circuit 401 is typically formed of a transistor, and FIG. 4 shows an example where the voltage generation circuit 401 in particular is formed of a MOS transistor MP202. The MOS transistor MP202 is off except during a write, which makes the antifuse element Ca electrically cut off from the VH terminal, which is a power source pad. In such a state, an additionally-provided read circuit 404 performs other operations such as read determination. The MOS transistor MP202 can properly maintain its off-state under the environment where the power source voltage and the ground voltage are stable. However, in a case where high-frequency noise or a surge voltage enters the VH terminal from the outside due to electrostatic discharge, lightening surge, or the like, they may pass through the MOS transistor MP202 due to, e.g., a parasitic capacitance Cp201 formed at the MOS transistor MP202 and reach wiring Z. Particularly in a case where a surge voltage reaches the wiring Z during a read operation, the read circuit 404 may break, or information may be erroneously written to the antifuse element Ca.

Thus, in the present embodiment, as shown in FIG. 1, a noise detection circuit 102 is connected near the VH terminal through which a noise voltage such as a surge voltage enters. Then, a transistor MND2 (hereinafter also referred to as a noise discharge switch MND2) that functions as a noise discharge switch is connected to the wiring A to protect the antifuse element Ca from the noise voltage and to thereby provide measures against noise. Specifically, anti-noise measures are taken by connecting a first connection terminal of the noise discharge switch MND2 to an intermediate node CC on the wiring A between the output terminal of the voltage generation circuit 101 and the terminal AA and connecting a second connection terminal of the noise discharge switch MND2 to the ground GND. In this configuration, the noise detection circuit 102 detects a noise voltage entering through the VH terminal and outputs a detection signal Vgn1. The noise discharge switch MND2 is turned on by the detection signal Vgn1. The noise discharge switch MND2 is thus enabled to discharge noise current by the detection signal Vgn1. As a result, the noise discharge switch MND2 discharges the noise current entering the wiring A to the ground GND. This helps prevent a rise in the voltage on the wiring A before the surge voltage reaches the antifuse element Ca.

Note that the GND potential is a GND potential at the substrate on which circuits like the ones shown in FIGS. 1 to 3 are mounted. As will be described later, in a case where such circuits are mounted on an inkjet printing element substrate, the GND potential is a GND potential at the inkjet printing element substrate. GND wiring on a substrate is usually electrically connected, either directly or via another substrate, to a housing of an apparatus in which the substrate is mounted (an image formation apparatus or a copier in a case of an inkjet printing element substrate to be described later). Also, the housing is grounded to the ground via a ground wire. Thus, current that flows into GND of the substrate via the noise discharge switch MND2 in a conductive state and then through the terminal CC is discharged to the ground via the housing of the apparatus. Note that the potential of the housing in reference to the potential of the ground is not necessarily zero volt. Also, neither the GND potential of the substrate in reference to the potential of the ground nor the GND potential of the substrate in reference to the potential of the housing is necessarily zero volt. Write voltage is in reference to the GND potential of the substrate. The circuits shown in FIGS. 1 to 3 may be provided on a single semiconductor device or over a plurality of semiconductor devices, but in any case, all the semiconductor devices are grounded to the substrate. However, the GND of the substrate may be not connected to the housing considering the noise which may occur at the housing. In such a case, for example, GND of the substrate may be given a large capacity so that noise current may be absorbed by GND.

Figure 5:
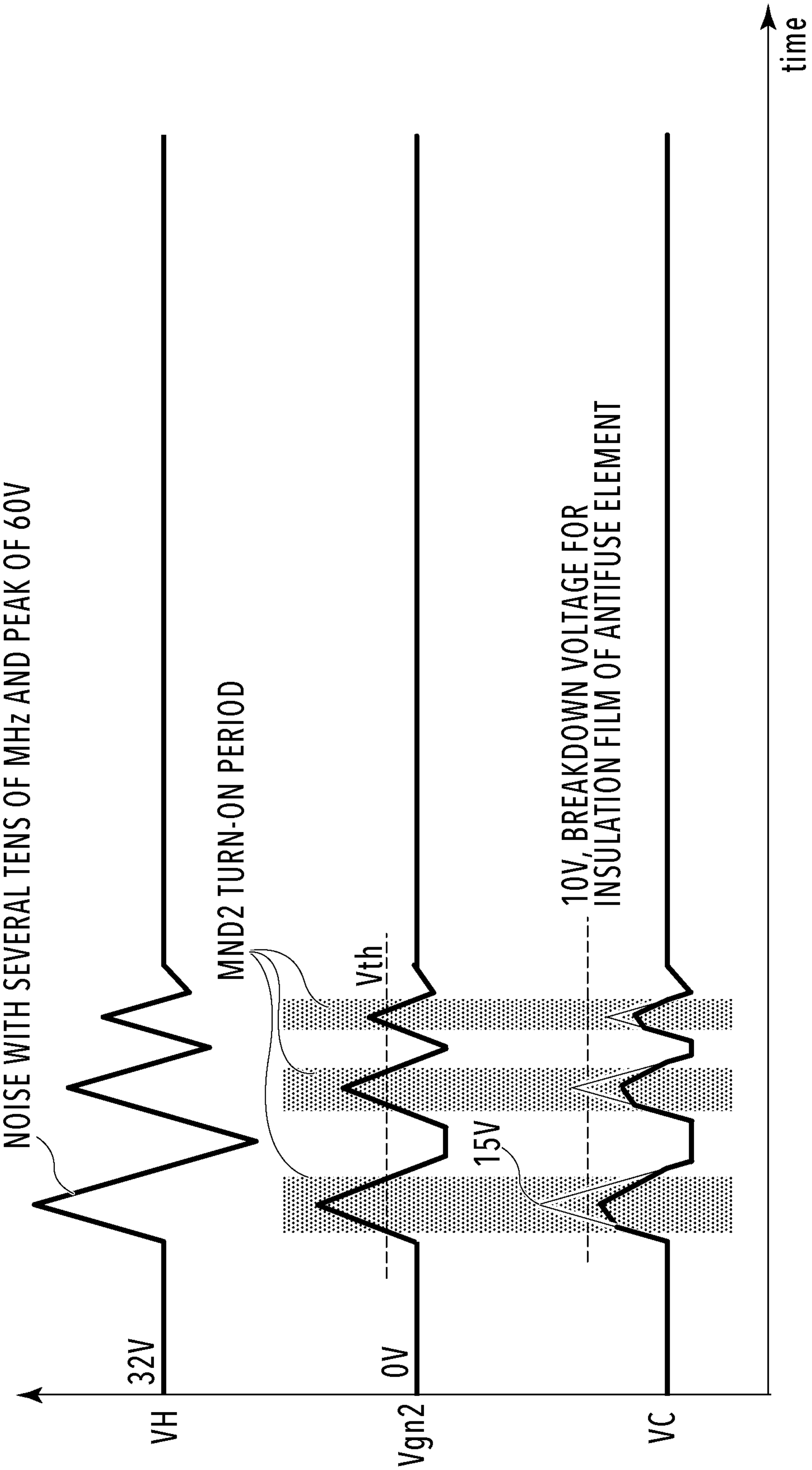
FIG. 5 is a graph showing an example of operation waveforms of the circuit of the first embodiment.

More detailed voltage waveforms are described using an example in FIG. 5 based on the circuitry diagram in FIG. 2. The VH waveform shows a noise voltage applied to the VH terminal. In a steady state, high voltage (e.g., 32V) is supplied to the VH terminal to which voltage as write voltage is supplied. In a read of information, the high-withstand-voltage transistor MPD1 in the voltage generation circuit 101 is off, and thus, the value of voltage on the wiring C is equal to the power supply voltage VDD or the value of read voltage for the antifuse element Ca.

If a noise voltage with several tens of MHz and a peak of 60 V is applied to the VH terminal, the high frequency component is transmitted to the wiring C via the parasitic capacitance Cp. Particularly in a case where there is no circuit for providing anti-noise measures of the present embodiment, the voltage on the wiring C may reach up to 15 V, as shown with the VC waveform denoted with a thin line in FIG. 5. In a case where the breakdown voltage for the insulation film of the antifuse element Ca is 10 V, information is written to the antifuse element Ca.

By contrast, in a case where there is an anti-noise circuit of the present embodiment, a noise detection capacitance Cn1 in the noise detection circuit 102 blocks the power supply voltage VDD but transmit the high frequency component of the noise voltage. As a result, a noise detection signal Vgn2 supplied to the gate of the transistor MND2, which functions as a noise discharge switch, rises as shown with the Vgn2 waveform in FIG. 5. In other words, the gate voltage of the transistor MND2 rises. Then, the noise discharge switch MND2 turns on in a MND2 turn-on period in which the noise detection signal Vgn2 exceeds a threshold voltage (Vth) for turning on the noise discharge switch MND2. This enables the surge current flowing to the wiring C to be discharged to the ground GND via the noise discharge switch MND2.

Thus, as shown with the thick-line VC waveform in FIG. 5, a rise in the voltage on the wiring C is reduced so that the voltage on the wiring C can be maintained at or lower than 10 V, which is the breakdown voltage for the insulation film of the antifuse element Ca. Thus, a situation can be prevented where a noise voltage entering through the VH terminal causes information to be erroneously written to the antifuse element Ca. Note that the noise detection capacitance Cn1 and the noise discharge switch MND2 need to be formed of a high-withstand-voltage capacitance and a high-withstand-voltage transistor so as not to break down even with application of high voltage (e.g., 32 V) in normal usage or a noise voltage. Also, the noise detection circuit 102 includes a pull-down resistance Rn1 so that the noise discharge switch MND2 may not turn on in a state where noise does not enter, i.e., in a steady state where the voltage at the VH terminal is stable. Also, although not shown, it is preferable that a protection diode typically used as a protection element be connected between the VH terminal and GND so that the element may not break down due to a noise voltage. The noise detection circuit 102 is formed by the noise detection capacitance Cn1 and the pull-down resistance Rn1 and can be seen as a high-pass filter that blocks DC voltage of the power source supplied through the VH terminal and transmits noise.

As shown in FIG. 3, the resistance element Rp is preferably connected in parallel to the antifuse element Ca. Without the resistance element Rp, with application of write voltage to wiring D, high voltage may be applied to both ends of the antifuse element Ca despite the fact that the write control switch MND1 is off, and this may result in information being written to the antifuse element Ca. This can be prevented by parallel connection of the resistance element Rp to the antifuse element Ca.

Figure 6:
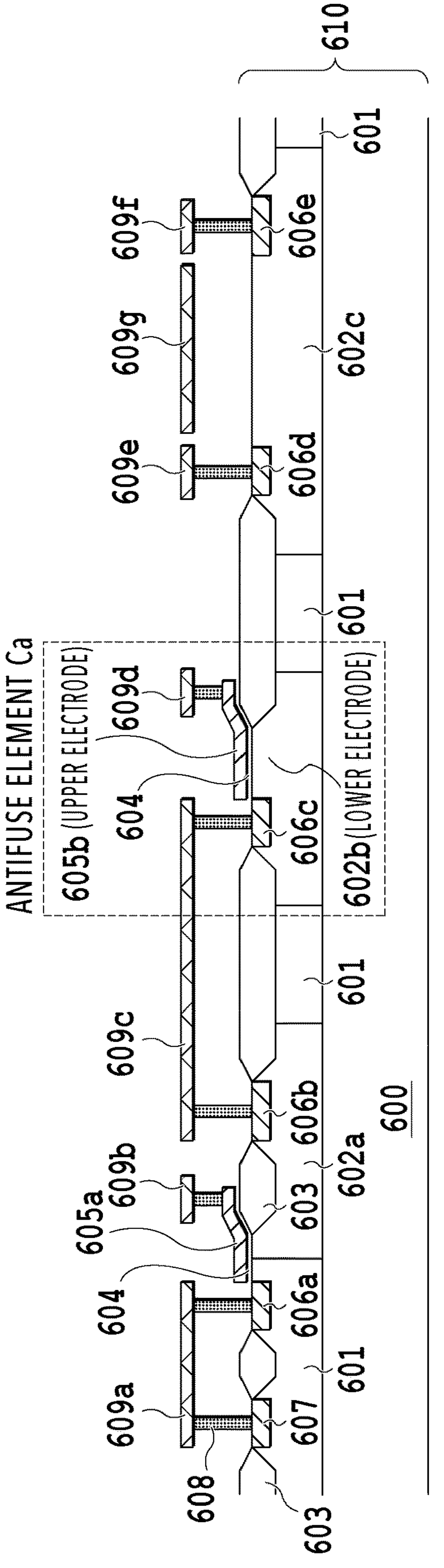
FIG. 6 is a schematic diagram of a sectional structure of the semiconductor device of the first embodiment.

Next, FIG. 6 shows a specific example of a sectional structure of the antifuse element Ca, the resistance element Rp, and the transistor MND1 shown in FIG. 3. A semiconductor substrate 610 has a p-well region 601 and n-well substrates 602*a*, 602*b*, and 602*c* formed on a p-type silicon substrate 600. The p-well region 601 can be formed in the same step for forming a p-well in the NMOS transistor forming the logic circuit. The n-well substrates 602*a*, 602*b*, and 602*c* can be formed in the same step for forming an n-well in the PMOS transistor forming the logic circuit.

Note that the impurity concentration in the n-well regions with respect to the p-type silicon substrate 600 is a concentration such that the breakdown voltage between the n-well substrates 602*a*, 602*b*, and 602*c* and the p-type silicon substrate 600 is higher than the voltage at the VID terminal at the high voltage. Also, the impurity concentrations in the p-well region 601 and the n-well substrates 602*a*, 602*b*, and 602*c* are concentrations such that the breakdown voltage between the p-well region 601 and the n-well regions 602*a*, 602*b* is higher than the voltage at the VID terminal at the high voltage.

In the p-well region 601 and the n-well substrates 602*a*, 602*b*, and 602*c*, a field oxide film 603, high-concentration n-type diffusion regions 606*a* to 606*e*, and a high-concentration p-type diffusion region 607 are formed. The field oxide film 603 can be formed using, for example, local oxidation of silicon (LOCOS).

The configuration of the transistor MND1, which is a high-withstand-voltage NMOS transistor, is described. A gate electrode 605*a* is disposed on the adjacent p-well region 601 and n-well region 602*a* with a gate insulation film 604 interposed therebetween. A region where the p-well region 601 and the gate electrode 605*a* overlap is a channel formation region.

The high-concentration n-type diffusion region 606*a* is the source of the transistor MND1, and the high-concentration p-type diffusion region 607 is the back gate electrode. The n-well region 602*a* has a portion extending to the lower portion of the gate electrode 605*a* as a drain's field mitigation region. The high-concentration n-type diffusion region 606*b* formed in the n-well region 602*a* serves as the drain electrode of the transistor MND1.

Further, the gate electrode 605*a* has a structure such that its drain side extends onto the field oxide film 603 formed in the n-well region 602*a*, i.e., a LOCOS offset structure. This enables gate-drain withstand voltage to be secured even in a case where the voltage of the drain electrode rises to the voltage of the VID terminal at high voltage with the transistor MND1 being off, i.e., with the voltage at the gate electrode being the GND potential.

Next, the structure of the antifuse element Ca is described. The antifuse element Ca has an upper electrode, a lower electrode, and an insulation film therebetween. For example, the electrode 605*b* provided on the n-well region 602*b* with the gate insulation film 604 interposed in between functions as the upper electrode of the antifuse element Ca. A portion of the n-well region 602*b* functions as the lower electrode, the portion being connected to the high-concentration n-type diffusion region 606*c* and overlapping with the upper electrode in a plan view of the surface where elements such as the transistor MND1 of the semiconductor substrate 610 are disposed. Note that a plan view of the surface where elements such as the transistor MND1, the antifuse element Ca, and the resistance element Rp are disposed is, for example, a plan view of the surface of the channel formation region of the transistor MND1.

Although in FIG. 6 the high-concentration n-type diffusion region 606*c* is formed only in a region of the n-well region 602*b* not overlapping with the upper electrode in a plan view, the high-concentration n-type diffusion region 606*c* is not limited to this. For example, the high-concentration n-type diffusion region 606*c* may be formed over part of the portion overlapping with the upper electrode or over the entire overlapping portion. In a case where the high-concentration n-type diffusion region 606*c* is also formed in the region overlapping with the upper electrode in a plan view, the overlapping portion of the high-concentration n-type diffusion region 606*c* too functions as the lower electrode of the antifuse element Ca.

Further, although in FIG. 6 the lower electrode of the antifuse element Ca is connected to the drain of the transistor MND1, the upper electrode may be connected to the drain of the third transistor MND1, and the lower electrode may be connected to the high voltage (the first terminal AA shown in FIG. 1).

The gate insulation film 604 can be formed in the step for forming the gate insulation film of the transistor MP1 and the transistor MN1 forming the logic circuit, and can be formed using, for example, an oxide film. Also, the electrodes 605*a*, 605*b* can be, for example, a polysilicon layer. The polysilicon layer, the high-concentration n-type diffusion regions 606*a* to 606*c*, and the high-concentration p-type diffusion region 607 can be formed in the same step for forming the elements of the transistor MP1 and the transistor MN1 forming the low-voltage logic circuit.

As thus described, the antifuse element Ca is a capacitance element having a MOS structure, and a transistor that controls writes to the antifuse element Ca is a MOS transistor. Thus, the antifuse element Ca and the transistor can be formed in the same step, which allows the semiconductor device to be formed with fewer steps inexpensively.

An insulation film provided with a plurality of contact portions 608 is provided on the high-concentration p-type diffusion region 607, the n-type diffusion regions 606*a* to 606*e*, and the field oxide film 603, and conductive layers 609*a* to 609*e* are provided on the insulation film. The conductive layers 609*a* to 609*e* can be formed of, for example, metal such as aluminum. Note that there are no limitations as to the manufacturing method, materials, and structures of the conductive layers 609*a* to 609*e*, the electrodes, and the wiring as long as they are electrically connected.

Although a capacitance element whose lower electrode and upper electrode are formed of an n-well region and polysilicon is shown as an example of the antifuse element Ca in FIG. 6, the antifuse element Ca is not limited to this structure and may be, for example, a capacitance element using a PMOS transistor. One of the lower electrode and upper electrode of the antifuse element Ca functions as one terminal, and the other one of them functions as the other terminal.

The resistance element Rp is a diffusion resistance. The resistance element Rp has the n-well region 602*c*, which is a semiconductor region in the semiconductor substrate 610, and is connected to the conductive layers 609*d* and 609*e* via the high-concentration n-type diffusion regions 606*d* and 606*e*, respectively. The resistance element Rp is not limited to this structure. For example, a resistor formed of a conductive layer and a resistor formed of polysilicon may be used as the resistance element Rp.

The insulation film is an insulator layer formed on the semiconductor substrate 610 to cover the transistor MND1, the resistance element Rp, and the like, and is formed of, for example, silicon oxide. The insulation layer is not limited to this, and may be formed of silicon nitride or silicon carbide or may be a lamination of these or a layer of a mixture of these.

The conductive layer 609*a* is connected to the source and the back gate of the transistor MND1 via the contact portions 608 and is given the ground potential. The conductive layer 609*b* is connected to the drain electrode of the transistor MND1 and the lower electrode of the antifuse element Ca via the contact portion 608. The conductive layer 609*c* is connected to the upper electrode of the antifuse element Ca via the contact portions 608, and is connected to the first terminal AA shown in FIG. 1 at its portion not shown. In the event of a write, high voltage (e.g., 32 V) is applied to the conductive layer 609*c* via the first terminal AA. The conductive layer 609*d* is connected to the conductive layer 609*c* (not shown), and the conductive layer 609*e* is connected to the conductive layer 609*b* (not shown).

Second Embodiment

Figure 7:
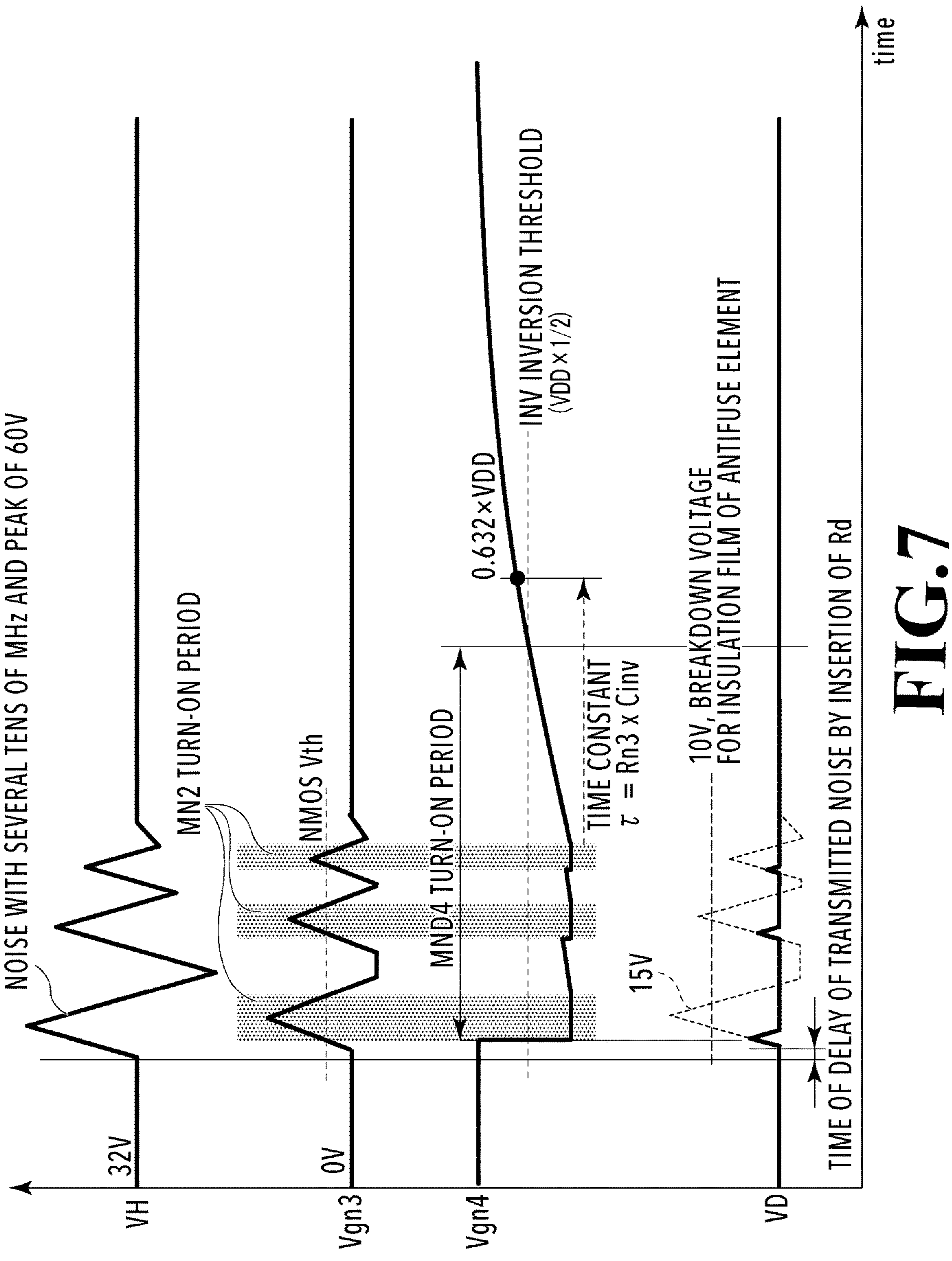
FIG. 7 is a graph showing an example of operation waveforms of the circuit of a second embodiment.

In the present embodiment, FIG. 3 shows the noise detection circuit 302 that discharges noise current to the ground GND efficiently by driving the noise discharge switch more stably. The noise detection circuit 302 receives, at a transistor MN2, a signal of a noise detection capacitance Cn2. The present embodiment employs a configuration in which the noise discharge switch MND4 is driven in accordance with a signal Vgn5 obtained by a logical inversion element INV1 by logically inverting a signal Vgn4 which is obtained by voltage division of the logic power supply voltage VDD by a pull-up resistance Rn3 and the transistor MN2. FIG. 7 is used to describe detailed voltage waveforms. The VH waveform is a waveform having noise voltage superimposed on high voltage (32 V), and voltage of such a waveform is supplied to the VH terminal upon occurrence of noise. In a read of information, the high-withstand-voltage transistor MPD1 in the voltage generation circuit 101 is off; thus, the value of the voltage on the wiring D is equal to the value of the power supply voltage VDD or the read voltage for the antifuse element Ca. If noise voltage of several tens of MHz and a peak of 60 V is applied to the VH terminal in addition to high voltage, the high frequency component of the noise voltage is transmitted to the wiring D via the parasitic capacitance Cp. Without the anti-noise circuit (the noise detection circuit 302 and the noise discharge switch MND4) of the present embodiment, the voltage on the wiring D may reach 15 V as shown with the broken-line VD waveform in FIG. 7. By contrast, with the anti-noise circuit of the present embodiment, the noise detection capacitance Cn2 in the noise detection circuit 302 blocks the power supply voltage VDD but transmits the high frequency component of the noise voltage. As a result, a noise detection signal Vgn3 supplied to the gate of the transistor MN2 rises as shown with the Vgn3 waveform in FIG. 7. In other words, the gate voltage of the transistor MN2 rises. The transistor MN2 is on during the transistor MN2 turn-on period in which the voltage of the noise detection signal Vgn3 exceeds the threshold voltage (Vth) for turning on the transistor MN2. Once the transistor MN2 turns on, the signal Vgn4 to the input terminal of the logical inversion element INV1 becomes 0 V. Thus, the voltage of the signal Vgn5, which is an output signal from the logical inversion element INV1, i.e., the gate voltage of the noise discharge switch MND4, becomes turn-on voltage (=the power supply voltage VDD). Consequently, the noise current flowing to the wiring D can be discharged to the ground GND via the noise discharge switch MND4.

The noise voltage falls after reaching a peak value. In accordance with this, the noise detection signal Vgn3 falls too, and then the transistor MN2 switches from on to off. However, a low-pass filter is formed at the input terminal of the logical inversion element INV1, the low-pass filter having a time constant $\tau$=Rn3×Cinv, determined by the pull-up resistance Rn3 and a capacitance Cinv given to the gate of the logical inversion element INV1. Thus, the voltage of the signal Vgn4 inputted to the logical inversion element INV1 requires a time in proportion to the time constant t to transition from 0 V to the power supply voltage VDD. In order for the signal Vgn5 outputted from the logical inversion element INV1 to be logically inverted, the voltage of the signal Vgn4 inputted to the logical inversion element INV1 needs to exceed a threshold voltage (approximately ½ of the power supply voltage VDD). For this reason, the noise discharge switch MND4 is on during a period in which the voltage of a signal Vng4 does not exceed the threshold voltage (the MND4 turn-on period), which enables the noise current to keep flowing to the ground GND.

For example, in a case where Rn3=100 kΩ and Cinv=1 pF, the time constant $\tau$=1 μsec, and the time it takes for the voltage of the signal Vgn4 to change from 0 V to the threshold voltage is approximately 0.7 μsec. Thus, for 0.7 μsec since the start of a rise in the voltage of the signal Vgn4, the noise discharge switch MND4 can continue the discharge of the noise current.

Thus, the transistor MN2, the pull-up resistance Rn3, and the capacitance Cinv function as a waveform shaper which makes long the period in which the noise maintains voltage near the peak value. Also, referring to FIG. 7, an output of the logical inversion element INV1 has a logical level "HIGH" in a period in which the level of the signal Vng4 inputted to the logical inversion element INV1 is equal to or lower than the inversion threshold (VDD×½). Voltage corresponding to the logical level "HIGH" is voltage that turns on the transistor MND4. Thus, the transistor MN2, the pull-up resistance Rn3, the capacitance Cinv, and the logical inversion element INV1 as a whole function as a waveform shaper, or a monostable multivibrator, that makes long the period in which noise maintains the peak value. Also, particularly in a case where noise has the peak value successively, every time the noise has the peak value, this waveform shaper updates the period in which noise maintains the peak value so that the period starts therefrom. Thus, the transistor MN2, the pull-up resistance Rn3, the capacitance Cinv, and the logical inversion element INV1 as a whole can also be seen as functioning as a retriggerable monostable multivibrator that takes the peak pulse of noise as a trigger. Alternatively, the transistor MN2, the pull-up resistance Rn3, the capacitance Cinv, and the logical inversion element INV1 as a whole can also be seen as functioning as a pulse width expansion circuit that expands the pulse width of noise, or as a retriggerable pulse width expansion circuit because the pulse width of noise is expanded every time the noise has the peak value. The noise discharge switch MND4 makes it possible for noise current to be discharged from the wiring by recognizing the period in which the pulse width is being expanded by the pulse width expansion circuit as a period in which the noise detection circuit 302 is detecting noise.

Also, in the present circuit configuration, the voltage of the signal Vgn5 can be constantly kept at the power supply voltage VDD while the noise discharge switch MND4 is driven; thus, the current drive capability of the transistor can be maintained to be high more, compared to the noise detection circuit 102 of the first embodiment. Specifically, as shown in FIG. 7, in a case where the noise voltage has the peak a plurality of times in a short period of time, a situation where discharge stops between the peaks can be prevented. Thus, noise current can flow to the ground GND more efficiently, and as shown with the solid-line VD waveform in FIG. 7, a rise in the voltage on the wiring D can be reduced. Consequently, the voltage on the wiring D can be kept at or lower than 10 V, which is the breakdown voltage for the insulation film of the antifuse element Ca, which makes it possible to prevent an erroneous write to the antifuse element Ca due to noise voltage entering through the VH terminal.

Further, by the time the noise discharge switch MND4 is turned on upon noise detection by the noise detection circuit 302, noise voltage may have passed through the voltage generation circuit 101 and reached the wiring D. To avoid this, in the present embodiment, as shown in FIG. 3, a noise delay resistance element Rd is inserted between the output terminal of the voltage generation circuit 101 and the intermediate node CC. The intermediate node CC is between the output terminal of the voltage generation circuit 101 and the terminal AA, on the wiring D. Also, the noise discharge switch MND4 has its first connection terminal connected to the intermediate node CC and its second connection terminal connected to the ground GND. With such a configuration, as shown with the VD waveform in FIG. 7, noise entering the wiring D can be delayed, and the noise discharge switch MND4 can be turned on before the voltage of VD rises. The resistance value of the noise delay resistance element Rd is as small as, for example, approximately several tens of Ω in order to prevent the noise delay resistance element Rd from causing a voltage drop or restricting write current in the event of a write to the antifuse element Ca. This can be achieved by, for example, forming the noise delay resistance element Rd in a polysilicon layer, which has a small resistance value, or forming the noise delay resistance element Rd using high-concentration n-type diffusion.

Figure 8:
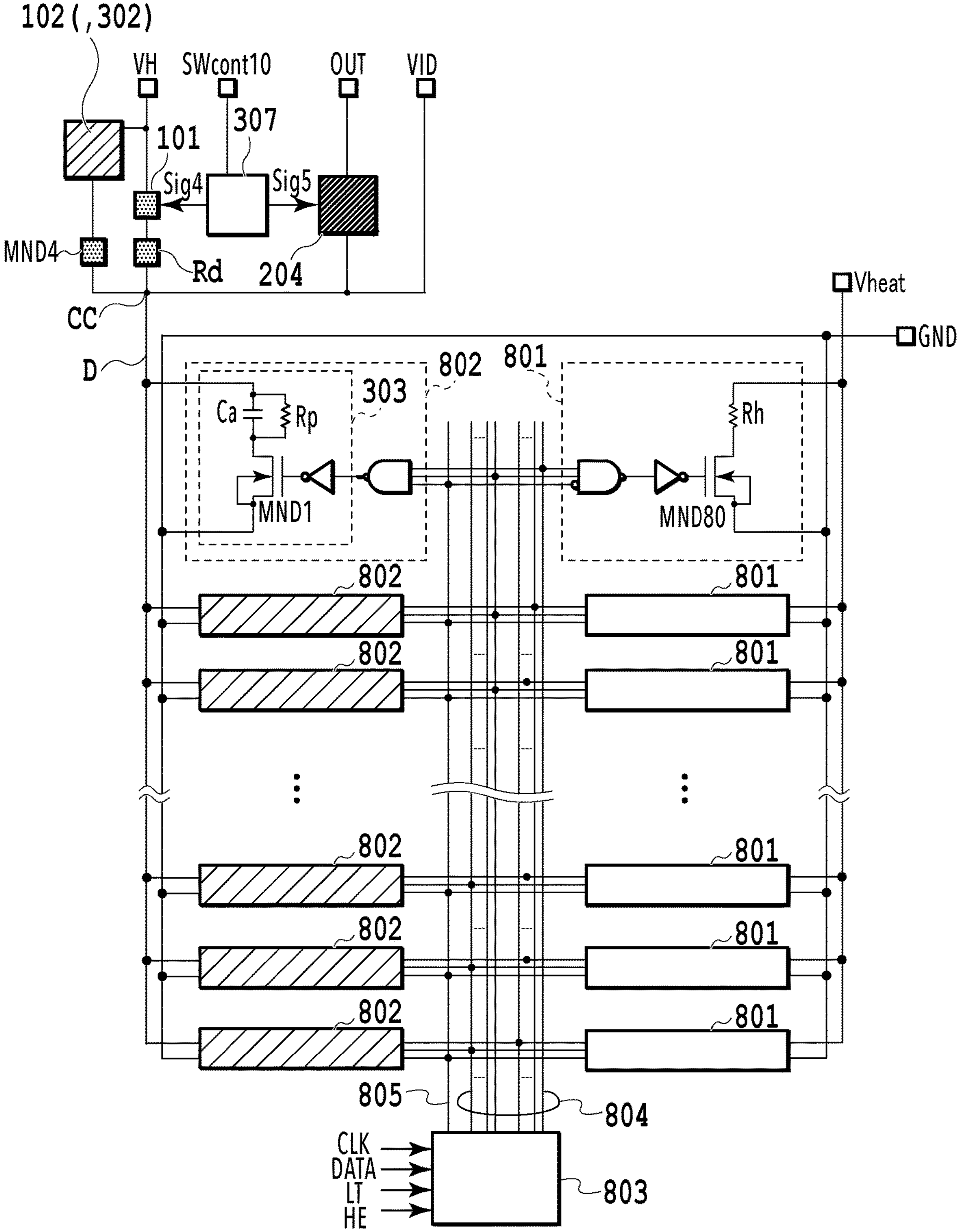
FIG. 8 is an example circuit configuration of an inkjet printing element substrate of the second embodiment.

FIG. 8 shows a circuit configuration where the anti-noise circuit of the present embodiment is mounted on an inkjet printing element substrate. The inkjet printing element substrate includes a plurality of printing element modules 801 and a plurality of memory modules 802. Each printing element module 801 includes a printing element Rh and a transistor MND80 connected in series between a power source Vheat and the ground GND. Each memory module 802 includes the memory unit 303. The printing element Rh may be a heater for heating ink in a pressure chamber in an inkjet printhead or may be a piezoelectric element for driving ink in the pressure chamber. The inkjet printing element substrate has a plurality of the antifuse elements Ca, and for example, information associated with the inkjet printing element substrate is written to the plurality of antifuse elements.

A selection circuit 803 supplies a function selection signal 805 for selecting either the printing element Rh or the antifuse element Ca to a selection logical element in each printing element module 801 and in each memory module 802. The selection circuit 803 also supplies a bit selection signal 804 for switching whether each bit is selected or not selected to the selection logical element in each printing element module 801 and in each memory module 802.

As is apparent from FIG. 8, the noise detection circuit 102 is disposed closer to the VH terminal, which is an external connection terminal, than the voltage generation circuit 101 is. Also, the noise detection circuit 102 is disposed closer to the VH terminal, which is an external connection terminal, than the antifuse element Ca is. Once the noise detection circuit 102 detects noise, the noise discharge switch MND4 is turned on before the noise reaches the intermediate node CC via the voltage generation circuit 101 and the noise delay resistance element Rd. This makes it possible to prevent the noise from entering the printing element modules 801 and the memory modules 802.

Figure 9:
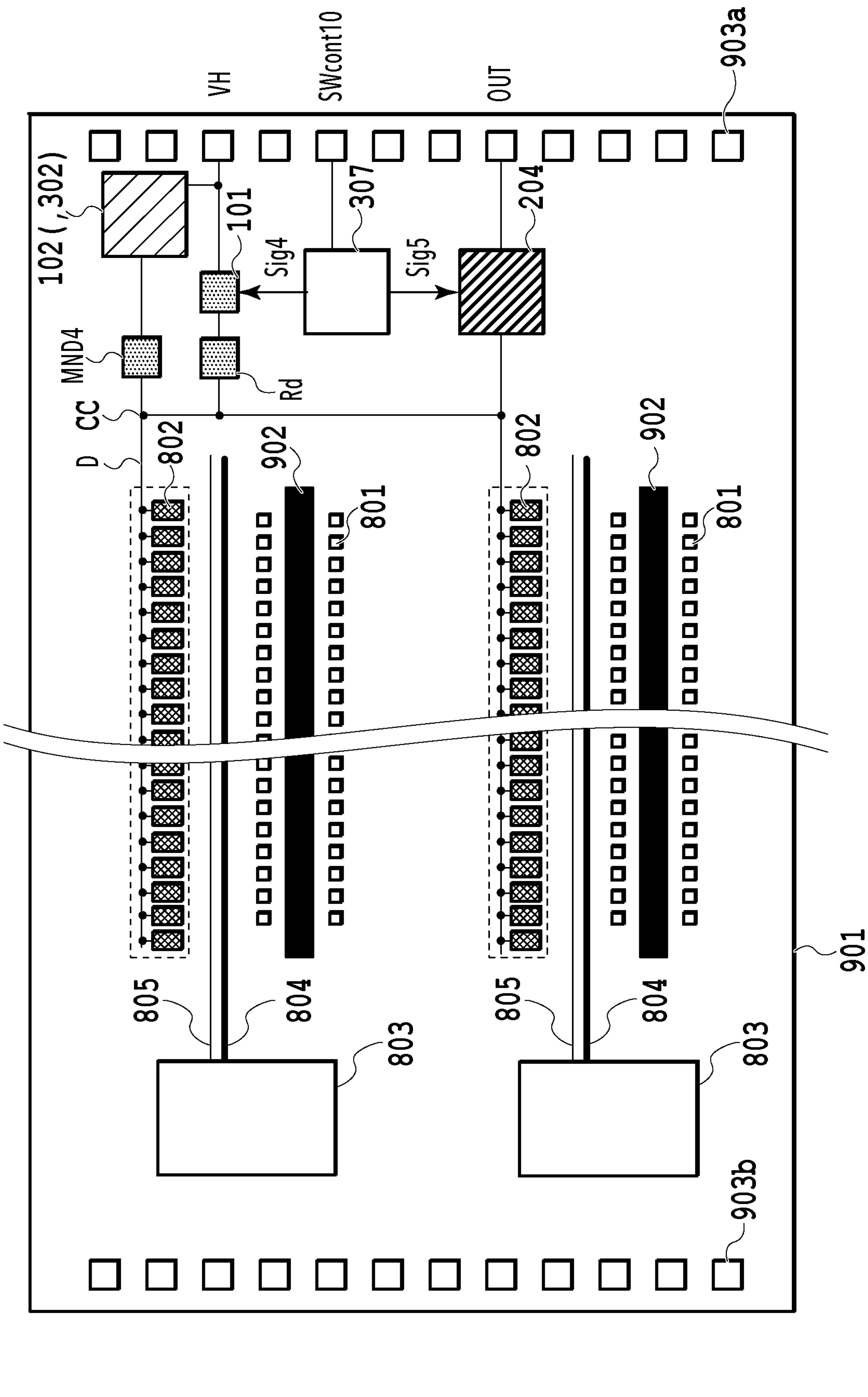
FIG. 9 is an example arrangement on the inkjet printing element substrate of the second embodiment.

FIG. 9 shows an example where the anti-noise circuit of the present embodiment is disposed on an inkjet printing element substrate 901. The memory modules 802 are arrayed in parallel with the direction in which the printing element modules 801 are arrayed, and at the ends of these arrays, an array of external connection terminals 903*a* and an array of external connection terminals 903*b* are disposed. The noise detection circuit 102, the noise discharge switch MND4, and the voltage generation circuit 101 are disposed in a region between the array of external connection terminals 903*a* and the array of printing element modules 801. The noise detection circuit 102 is preferably disposed adjacent to the VH terminal so as to be able to detect noise voltage with high sensitivity and high responsiveness. Also, the selection circuit 803 is disposed in a region between the array of external connection terminals 903*b* and the array of printing element modules 801. With the arrangement in FIG. 9, the outer shape of the inkjet printing element substrate and the symmetry with respect to ink supply ports 902 can be maintained as much as possible, and also, a region for wiring connection in the substrate can be made smaller.

Third Embodiment

Figure 10:
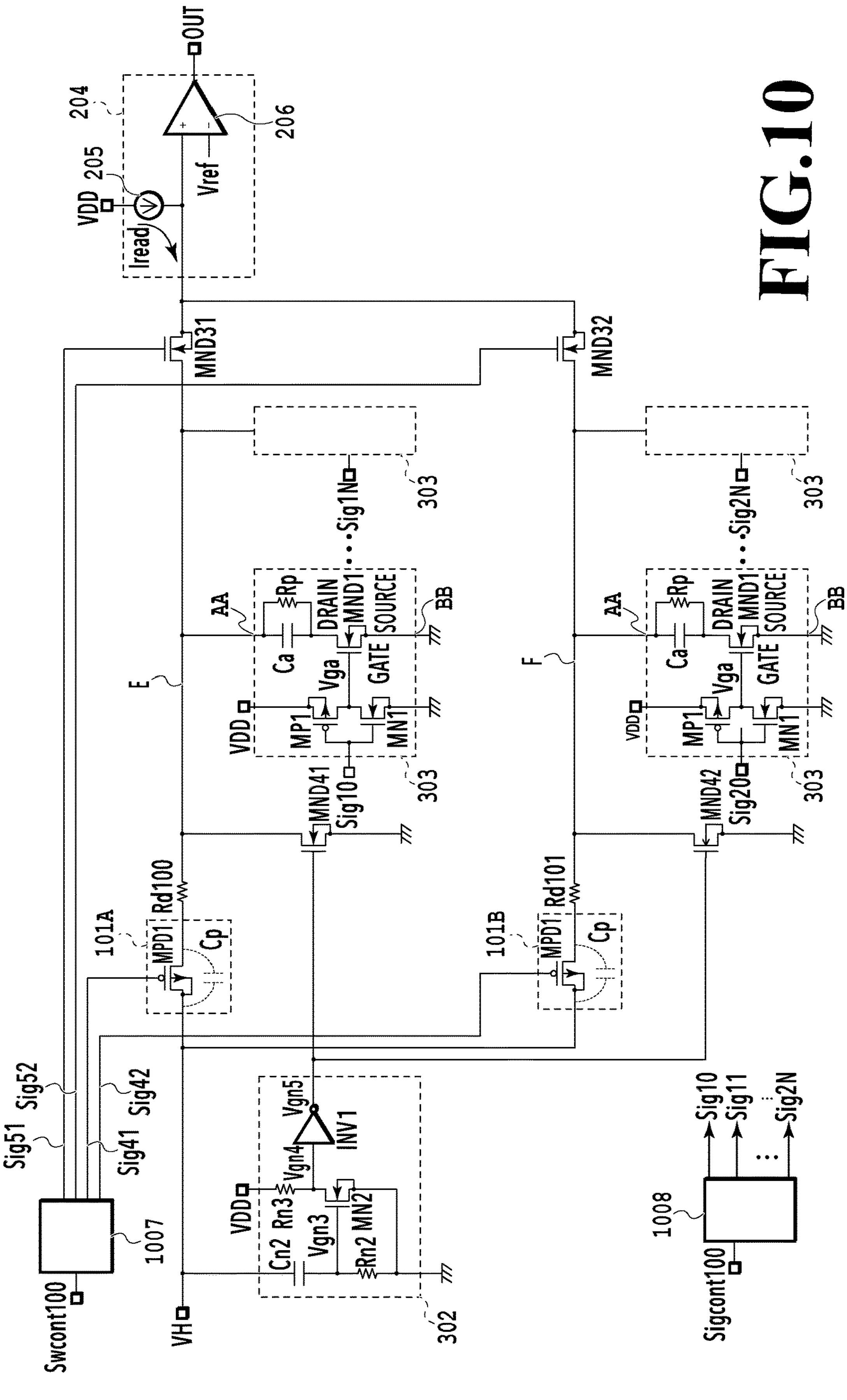
FIG. 10 is an example circuit configuration of a semiconductor device of a third embodiment.

The present embodiment shows an example where a plurality of the voltage generation circuits described in the embodiments above are disposed. FIG. 10 is a circuit configuration of a semiconductor device according to the present embodiment. The semiconductor device has a plurality of memory units 303 each being a set of the antifuse element Ca, the parallel resistance element Rp, the transistor MND1, and the logic inverter circuits MP1, MN1. Wiring E and wiring F are electrically isolated from each other, and respectively have voltage generation circuits 101A and 101B, noise discharge switches MND41 and MND42, and connection switches MND31 and MND32 for the read circuit 204. Thus, a plurality of memory units 303 are provided for the pair of the voltage generation circuit 101A and the noise discharge switch MND41, and also, a plurality of memory units are provided for the pair of the voltage generation circuit 101B and the noise discharge switch MND42.

Also, the pair of the voltage generation circuit 101A and the noise discharge switch MND41 and the pair of the voltage generation circuit 101B and the noise discharge switch MND42 are provided for a single noise detection circuit 302. The noise detection signal Vgn5, which is an output signal from the noise detection circuit 302, is connected to the gates of the noise discharge switches MND41, MND42. Upon noise detection, the noise discharge switches MND41, MND42 each receive the noise detection signal Vgn5 and turn on, and noise current entering each of the wiring E and the wiring F is thereby discharged to the ground GND.

Although the present embodiment shows an example where the semiconductor device has two voltage generation circuits for the sake of description, the semiconductor device may have more voltage generation circuits to increase the number of bits to write to the antifuse elements Ca within a single period of time. Similarly, to increase the number of bits to write to the antifuse elements Ca within a single period of time even more, the semiconductor device may have a plurality of read circuits. The configuration of the present embodiment makes it possible to prevent noise voltage entering through the VH terminal from causing an erroneous write to the antifuse element Ca.

Other Embodiments

The antifuse element Ca and the transistor MND1 may be interchanged. In this case, a circuit may be provided which switches the transistor MND1 on and off by controlling voltage between the source and the drain of the transistor MND1 in accordance with the logic level of the first write control signal Sig1.

Although the second terminal BB, the source of the transistor MND2, and the source of the transistor MN1 are connected to the ground GND in the embodiments described above, they may be connected to a power source with a certain potential.

The noise delay resistance element Rd in the embodiments described above may be changed to a different delay element.

Although the second terminal BB is connected to the ground GND in the embodiments described above, the configuration may be changed not to connect the second terminal BB to the ground GND. For example, a certain circuit may be inserted between the ground GND and the second terminal BB. In accordance with this change, the logic inversion circuit formed by the transistors MP1 and MN1 may be changed as needed.

Although the above embodiments described an example where the antifuse element is a property-variable element, the antifuse element is not limited to this in the present disclosure. The present disclosure encompasses property-variable elements such that their certain electrical property is changed due to a write as compared to before the write. For example, the present disclosure encompasses an element the resistance of which is increased by a write as compared to before the write and a property-variable element the electrical impedance of which is changed due to a write.

In the configuration described in the embodiments described above, the anti-noise circuit is used to protect the antifuse elements from a noise voltage such as a surge voltage. However, the present disclosure is not limited to this and also encompasses a configuration in which the anti-noise circuit is used to protect a different element or circuit from a noise voltage such as a surge voltage.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2023-091553, filed on Jun. 2, 2023, which is hereby incorporated by reference wherein in its entirety.

What is claimed is:

1. A semiconductor device comprising:

a one-time programmable (OTP) element, an electrical property of which changes with application of a voltage equal to or higher than a predetermined voltage to the OTP element;

a write control switch, connected in series between the OTP element and ground, that switches between a conductive state and a non-conductive state based on a first write control signal for controlling a write to the OTP element;

a voltage generation circuit that outputs a write voltage from an output terminal of the voltage generation circuit based on a power source and a second write control signal for controlling a write to the OTP element, the electrical property of the OTP element being changed due to the application of the voltage equal to or higher than the predetermined voltage to the OTP element when the write voltage is output from the output terminal of the voltage generation circuit and the write control switch is in the conductive state;

wiring that electrically connects the output terminal of the voltage generation circuit to the OTP element, for use to apply the voltage equal to or higher than the predetermined voltage to the OTP element;

a noise detection circuit that is electrically connected to the power source and detects noise at the power source;

a noise discharge switch having a first connection terminal electrically connected to the wiring at an intermediate node located between the output terminal of the voltage generation circuit and the OTP element and having a second connection terminal electrically connected to a discharge path, and which receives an output of the noise detection circuit as a control input, wherein the noise discharge switch enables noise current to be discharged from the wiring in an event where the noise detection circuit detects noise at the power source, and the noise detection circuit includes a high-pass filter that blocks a direct current voltage from the power source and transmits noise.

2. The semiconductor device according to claim 1, wherein the OTP element and the write control switch are disposed in series between a first terminal and a second terminal at ground potential, the output terminal of the voltage generation circuit and the first terminal are connected to each other via the wiring, and the ground potential at the second terminal is a potential that allows that the voltage equal to or higher than the predetermined voltage is to be applied to the OTP element when the write voltage is output from the output terminal of the voltage generation circuit and the write control switch is in the conductive state.

3. The semiconductor device according to claim 2, wherein ground potential of the second terminal is zero volts.

4. The semiconductor device according to claim 2, wherein the semiconductor device further comprises a delay element that is disposed between the output terminal of the voltage generation circuit and the intermediate node and that delays noise.

5. The semiconductor device according to claim 4, wherein the delay element is a resistance element.

6. The semiconductor device according to claim 1, wherein the noise discharge switch electrically connects the wiring to ground in an event where the noise detection circuit detects noise at the power source.

7. The semiconductor device according to claim 1, further comprising a resistance element connected to the OTP element in parallel.

8. The semiconductor device according to claim 7, wherein the resistance element is a diffusion resistance.

9. The semiconductor device according to claim 1, further comprising a read circuit that reads the electrical property of the OTP element.

10. The semiconductor device according to claim 9, wherein the read circuit includes a current source that generates current and a comparator, and the comparator compares, with a reference voltage, a voltage on the wiring generated in an event where the current is supplied to the OTP element.

11. The semiconductor device according to claim 9, wherein the voltage generation circuit and the read circuit are electrically connected to the wiring exclusively.

12. The semiconductor device according to claim 1, wherein the OTP element is an antifuse element, a resistance value of which is changed due to the application of the voltage equal to or higher than the predetermined voltage.

13. The semiconductor device according to claim 1, wherein the voltage generation circuit is formed of a p-type high-withstand-voltage transistor.

14. The semiconductor device according to claim 1, wherein the power source is supplied from an external connection terminal, and the noise detection circuit is disposed closer to the external connection terminal than any of the voltage generation circuit and the OTP element.

15. The semiconductor device according to claim 1, wherein a plurality of pairs of the OTP element and the write control switch are provided for a single set of the voltage generation circuit, the noise detection circuit, and the noise discharge switch.

16. The semiconductor device according to claim 1, wherein a plurality of pairs of the voltage generation circuit and the noise discharge switch are provided for the single noise detection circuit, and a plurality of pairs of the OTP element and the write control switch are provided for each of the pairs of the voltage generation circuit and the noise discharge switch.

17. A semiconductor device comprising:

a one-time programmable (OTP) element, an electrical property of which changes with application of a voltage equal to or higher than a predetermined voltage to the OTP element;

a write control switch, connected in series between the OTP element and ground, that switches between a conductive state and a non-conductive state based on a first write control signal for controlling a write to the OTP;

a voltage generation circuit that outputs a write voltage from an output terminal of the voltage generation circuit based on a power source and a second write control signal for controlling a write to the OTP, the electrical property of the OTP being changed due to the application of the voltage equal to or higher than the predetermined voltage to the OTP when the write voltage is output from the output terminal of the voltage generation circuit and the write control switch is in the conductive state;

wiring that electrically connects the output terminal of the voltage generation circuit to the OTP element, for use to apply the voltage equal to or higher than the predetermined voltage to the OTP;

a noise detection circuit that is electrically connected to the power source and detects noise at the power source; and a noise discharge switch having a first connection terminal electrically connected to the wiring at an intermediate node located between the output terminal of the voltage generation circuit and the OTP element and having a second connection terminal electrically connected to a discharge path, and which receives an output of the noise detection circuit as a control input, wherein the noise discharge switch enables noise current to be discharged from the wiring in an event where the noise detection circuit detects noise at the power source, wherein the noise detection circuit includes a pulse width expansion circuit that expands a pulse width of noise, and the noise discharge switch enables noise current to be discharged from the wiring by recognizing a period in which the pulse width is being expanded by the pulse width expansion circuit as a period in which the noise detection circuit is detecting noise.

18. An inkjet printing element substrate comprising:

a one-time programmable (OTP) element, an electrical property of which changes with application of a voltage equal to or higher than a predetermined voltage to the OTP element;

a write control switch, connected in series between the OTP element and ground, that switches between a conductive state and a non-conductive state based on a first write control signal for controlling a write to the OTP element;

a voltage generation circuit that outputs a write voltage from an output terminal of the voltage generation circuit based on a power source and a second write control signal for controlling a write to the OTP element, the electrical property of the OTP element being changed due to the application of the voltage equal to or higher than the predetermined voltage to the property-variable OTP element when the write voltage is output from the output terminal of the voltage generation circuit and the write control switch is in the conductive state;

wiring that electrically connects the output terminal of the voltage generation circuit to the OTP element, for use to apply the voltage equal to or higher than the predetermined voltage to the OTP element;

a noise detection circuit that is electrically connected to the power source and detects noise at the power source;

a noise discharge switch having a first connection terminal electrically connected to the wiring at an intermediate node located between the output terminal of the voltage generation circuit and the OTP element and having a second connection terminal electrically connected to a discharge path, and which receives an output of the noise detection circuit as a control input, wherein the noise discharge switch enables noise current to be discharged from the wiring in an event where the noise detection circuit detects noise at the power source, and the noise detection circuit includes a high-pass filter that blocks a direct current voltage from the power source and transmits noise.

* * * * *